United States Patent
Hummel et al.

(10) Patent No.: US 7,107,193 B1
(45) Date of Patent: Sep. 12, 2006

(54) DEFINING PARAMETERS FOR A FINITE ELEMENTS ANALYSIS CALCULATION IN A COMPUTER-ASSISTED DRAFTING PROGRAM

(75) Inventors: Peter Hummel, Amberg (DE); Igor Jacak, Kosice (SK); Stanislav Hutnan, Kosice (SK)

(73) Assignee: Autodesk, Inc., San Rafael, CA (US)

( * ) Notice: Subject to any disclaimer, the term of this patent is extended or adjusted under 35 U.S.C. 154(b) by 1306 days.

(21) Appl. No.: 09/651,031

(22) Filed: Aug. 30, 2000

(30) Foreign Application Priority Data

Sep. 3, 1999 (EP) .................................. 99117379

(51) Int. Cl.
*G06F 7/60* (2006.01)
*G06F 19/00* (2006.01)

(52) U.S. Cl. ................................ 703/2; 700/98; 700/1
(58) Field of Classification Search ................... 703/2; 395/133, 155, 123; 73/1; 345/423; 700/98
See application file for complete search history.

(56) References Cited

U.S. PATENT DOCUMENTS

| | | | |
|---|---|---|---|
| 4,933,889 A * | 6/1990 | Meshkat et al. ............... 716/20 |
| 5,029,119 A | 7/1991 | Konno | |
| 5,289,567 A * | 2/1994 | Roth ........................... 345/420 |
| 5,315,537 A * | 5/1994 | Blacker ........................ 716/20 |
| 5,492,002 A * | 2/1996 | Higgins et al. .............. 73/1.14 |
| 5,542,030 A * | 7/1996 | Gutfinger .................... 345/423 |
| 5,594,651 A * | 1/1997 | St. Ville ....................... 700/98 |
| 5,774,124 A * | 6/1998 | Itoh et al. .................... 345/423 |
| 5,796,617 A * | 8/1998 | St. Ville ....................... 700/98 |

OTHER PUBLICATIONS

Peter Budgell, Oct. 1998, ANSYS, "Finite Element Analysis MOdeling Issues and Ideas".*
Arabshahi, S. et al., "Steps Toward CAD-FEA Integration," *Engineering With Computers*, 1993, vol. 9, pp. 17-26, XP-002131561.
Arias, A. et al., "A Parametric Model of Structures Representation and its Integration in a Shape Optimal Design Procedure," Computer Aided Optimum Design of Structures 91, *Structural Systems and Industrial Applications*, Cambridge, MA, USA, Jun. 25-27, 1991; pp. 401-412, XP000879386.
Lu, S.C. et al., "Integration of CAD and FEA for Concurrent Engineering Design of Sheet Stamping," Transactions of the American Society of Mechanical Engineers, *Journal of Manufacturing Science and Engineering*, Aug. 1, 1996, vol. 118, pp. 310-317, XP000622438.

* cited by examiner

*Primary Examiner*—Anthony Knight
*Assistant Examiner*—Sunray Chang
(74) *Attorney, Agent, or Firm*—Gates & Cooper LLP

(57) ABSTRACT

A method for defining at least one parameter for a finite elements analysis (FEA) calculation in a computer-assisted drafting (CAD) program comprises the steps of determining a body for which said parameter is to be defined, said body being a entity processed by said CAD program; and using at least one graphical function of said CAD program to define a region within a face of said body, said region being used to define a load/support condition for said FEA calculation. A computer program product and an apparatus comprise corresponding features. The present invention provides an improved way of defining parameters like load or support conditions for an FEA calculation in a CAD program.

23 Claims, 6 Drawing Sheets

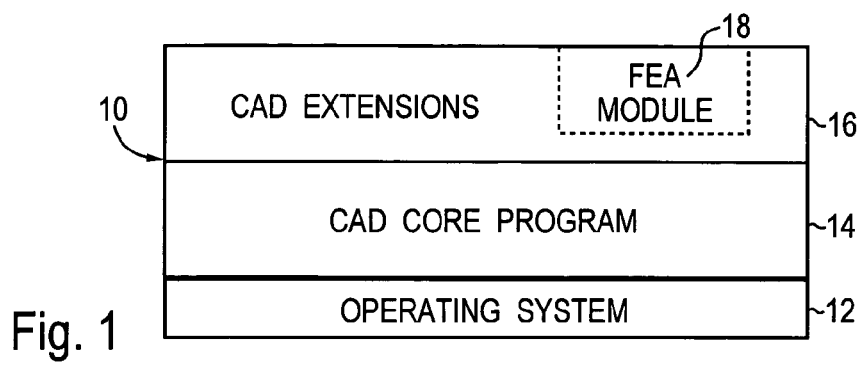
Fig. 1
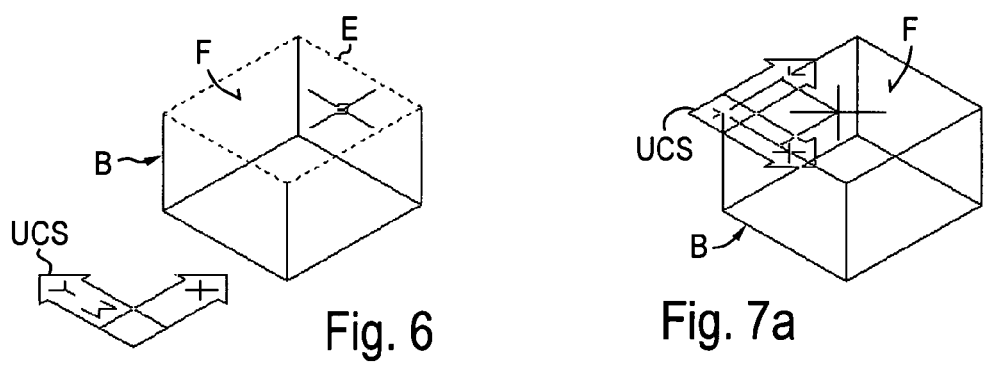
Fig. 6
Fig. 7a
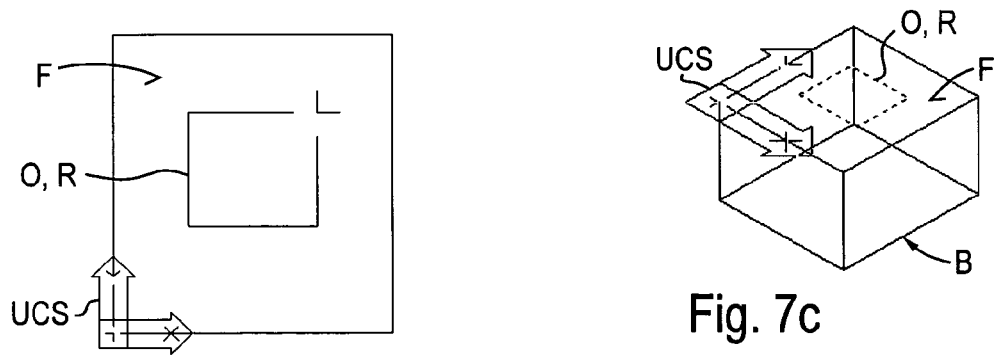
Fig. 7b
Fig. 7c

DEFINING PARAMETERS FOR A FINITE ELEMENTS ANALYSIS CALCULATION IN A COMPUTER-ASSISTED DRAFTING PROGRAM

CROSS-REFERENCE TO RELATED APPLICATIONS

This application claims priority under 35 U.S.C. §119 to European patent application No. 99-117-379.0, filed Sep. 3, 1999, by Peter Hummel, Igor Jacak, and Stanislav Hutnan, and entitled "DEFINING PARAMETERS FOR AN FEA CALCULATION IN A CAD PROGRAM," which application is incorporated by reference herein.

BACKGROUND OF THE INVENTION

1. Field of the Invention

The present invention concerns the fields of computer aided design (CAD) and finite elements analysis (FEA). In particular, the present invention concerns a way of improving the integration of these fields into a unified design environment.

2. Description of Related Art

The use of computer aided design (CAD) techniques has become common engineering practice. The available CAD programs range from simple drawing tools to sophisticated systems covering the whole range of product design and possibly further aspects like engineering or manufacturing or quality control. The term "CAD program" as used herein should therefore be understood in its broadest meaning as any computer program that contains a drawing and/or design component and possibly further components. A widely used CAD program is manufactured in various versions by Autodesk, Inc., San Rafael, USA under the trademark AutoCAD.

Another computer aided technique that has become common practice in the field of mechanical engineering is the technique of finite elements analysis (FEA). FEA is a very powerful numerical method for analyzing mechanical properties of bodies under given load conditions. For example, stress patterns and distributions or the deformation of a body under a load may be calculated and analyzed during the design process without the need for costly experiments. Overviews of the various steps and aspects of FEA can be found in the books "Finite-Element-Analysis, Grundlagen" by R. H. Gallagher, Springer-Verlag, Berlin 1976, and "The Finite Element Method" by O. C. Zienkiewicz and R. L. Taylor, 3rd edition, vol. 1, McGraw-Hill, New York 1977. The disclosure of these books is herewith incorporated in the present specification.

For many available FEA programs, the definition of the input parameters is a rather cumbersome process. While it is normally possible to import data defining the body to be analyzed from a CAD program, load and support parameters must be defined in a complex way. In other words, there is often too little compatibility and integration between independent CAD and FEA programs.

The article "Steps towards CAD-FEA Integration" by S. Arabshahi et al., Engineering with Computers, 1993, vol. 9, no. 1, pages 17–26, discloses an attribute editor using a graphical interface to enable the user to define and attach attributes to different regions of a solid model. A load for an FEA calculation can be assigned to an appropriate region of the model using the graphical interface.

A CAD program with integrated FEA functions is currently available under the trademark Genius Desktop 3 from Autodesk, Inc., San Rafael, USA. This program makes it possible to perform FEA for any three-dimensional body defined using the underlying CAD functionality. The results of the FEA calculations are also displayed for the user in a fully integrated way. However, the Genius Desktop 3 product imposes certain limitations with respect to the definition of load and support parameters (load/support conditions). It is only possible to define forces and fixed and movable supports that act on individual points or along edges or on whole faces (delimited by edges) of the body. These limitations restrict the variety of situations that can be modeled conveniently. Any attempt of the user to work around these limitations would be rather complex and time-consuming, and would furthermore decrease the accuracy of the finite elements analysis and increase the necessary computing time.

Therefore a need exists for improving the integration between CAD programs and FEA programs or program modules. In particular, a need exists for expanding the possibilities for defining parameters like load or support conditions for an FEA calculation in a CAD program. The invention has the objective of meeting these needs fully or at least partially.

SUMMARY OF THE INVENTION

The present invention provides a method for defining at least one parameter for an FEA calculation in a CAD program as defined in claim 1, a computer program product having the features of claim 16, and an apparatus having the features of claim 20. The dependent claims concern preferred embodiments of the invention.

A basic idea of the present invention is that at least one graphical function of the CAD program is used to define a region within a face of a body for which an FEA parameter is to be entered. This region is then used to define a load/support condition for the FEA calculation. For example, it may be defined that a fixed or movable support or a load acts on the defined region or on the portion of the face outside the defined region. In this respect, the wording "region within a face" means that the present invention makes it possible for the user to define regions that do not comprise the whole face. A "face" of a body is generally understood (as defined in the boundary representation model) to be a portion of the surface of the body delimited by edges, or the whole surface of the body if there are no edges (e.g. for spheres or tori). A "load/support condition" is a condition or parameter defining a load (force) acting on a body and/or a support of the body.

By allowing the user to define load/support conditions with respect to regions of a face of the body, the present invention opens a new class of possibilities for finite elements modeling. Consider the example that a user wants to model the mechanical properties of a table on which a drinking glass has been placed. Clearly, the weight of the glass only acts on the (usually circular) region where the glass contacts the table surface. Using the present invention, this situation can be modeled very conveniently by simply taking the region where the drinking glass is in contact with the table surface as the region used for defining the load/support condition. This region can be defined in a natural way using the functions provided by the CAD program.

Generally, all types of CAD functions and operations can be used for defining the region within the face of the object. This may include, in preferred embodiments, functions for drawing an object on the face of the body, and/or functions for drawing an object and projecting it onto the face of the body, and/or functions for subtracting (intersecting) the body from another object or body, and/or functions for selecting existing objects, and/or other functions. Especially in the context of powerful CAD programs implementing a wide variety of graphical functions, the range of possibilities is increased greatly. The face and/or the region may be flat or straight or curved.

The definition of one or more parameter/s for an FEA calculation in a CAD program is possible either in a way that FEA functions are tightly integrated into the CAD program, or in a way that only the parameter value/s is/are obtained in the CAD program and stored or output for use by an external FEA program. Both these extremes as well as intermediate possibilities (e.g., having a CAD and an FEA program running in parallel and communicating via operating system services) are contemplated for implementing the present invention. In the terminology used herein, an "FEA calculation" comprises all FEA steps including the initial mesh generation and subsequent calculation steps.

The load/support condition to be defined by the present invention preferably is a load condition or a (fixed or movable) support condition with respect to the region. This means that the load or support forces may apply either inside the region or outside the region (but normally inside the selected face).

In preferred embodiments in which a method of drawing an object is used for defining the region, an option may be provided for temporarily changing the displayed view of the body such that the region can be drawn more conveniently and/or more accurately.

Preferably it is possible to repeat the defining step such that several regions and several load/support conditions may be associated with a single face of the body. In preferred embodiments, provisions are made to process overlapping regions and/or load/support conditions in an appropriate way. In particular, these provisions may include determining intersection points between the defined regions and/or determining contact points between a defined region and an edge of the body and/or determining overlapping portions of the defined regions.

Preferred embodiments of the computer program product and the apparatus of the present invention also comprise the features mentioned above and/or in the dependent method claims.

BRIEF DESCRIPTION OF THE DRAWINGS

Further features, objects and advantages of the present invention will be apparent from the following detailed description of several sample and alternative embodiments of the invention. Reference is made to the schematic drawings, in which:

FIG. 1 shows a block diagram of the program structure used for implementing the present sample embodiment, FIG. 6 shows a body as displayed during face selection, FIG. 7a–FIG. 7c depict possible ways in which a body is displayed during the method of defining a region within a face in the present sample embodiment.

DETAILED DESCRIPTION OF THE PREFERRED EMBODIMENT

Figure 2:
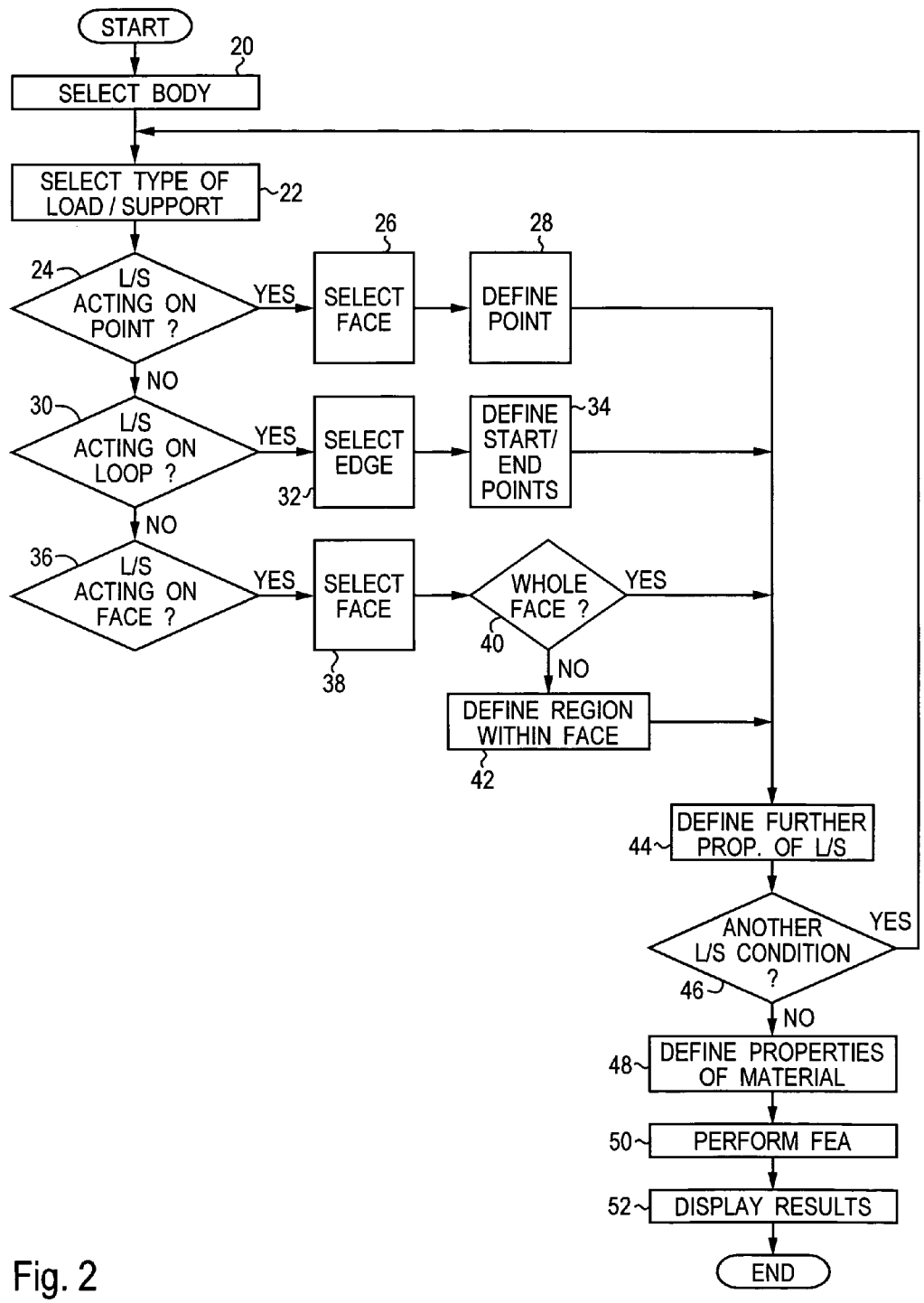
FIG. 2 shows a flow diagram of the context in which the present sample embodiment is embedded.

The present sample embodiment is implemented as a CAD program 10 (see FIG. 1). The CAD program 10 may run on a powerful PC type workstation having an operating system 12 like one of the operating systems known under the trademarks Windows 98 or Windows NT, available from Microsoft Inc., Redmond, USA. The CAD program 10 comprises a CAD core program 14 and CAD extensions 16, the CAD extensions 16 in turn containing an FEA module 18 for three-dimensional FEA calculations. In the present sample embodiment, the CAD core program 14 is the product known under the trademark AutoCAD 2000, available from Autodesk, Inc., San Rafael, USA, and the CAD extensions 16 are extensions for mechanical engineering design.

FIG. 2 shows the general steps provided by the CAD program 10 for performing FEA functions. The user initiates the sequence of FIG. 2 by either selecting a suitable menu item or typing an appropriate command ("amfea3d") at the command line prompt of the CAD program 10. The user is then asked, in step 20, to select a three-dimensional body B that is to be used for the finite element analysis. FIG. 6 shows an example of a cuboid shaped body B having a face F, the face F in turn being delimited by edges E. Furthermore, a user coordinate system UCS is shown in FIG. 6.

The body B selected in step 20 of FIG. 2 is an entity processed by the CAD program 10. Typically, the body must have been defined in the CAD program or imported from a third party source before it can be selected. In some embodiments, selection and import of the body B may occur at the same time, or selection of the body B may be assumed under predefined conditions (e.g., if the active data file loaded into the CAD program 10 contains only a definition of one body). In many embodiments, the body B is selected by the user clicking on a graphical representation of the body B displayed by the CAD program 10.

Figure 3:
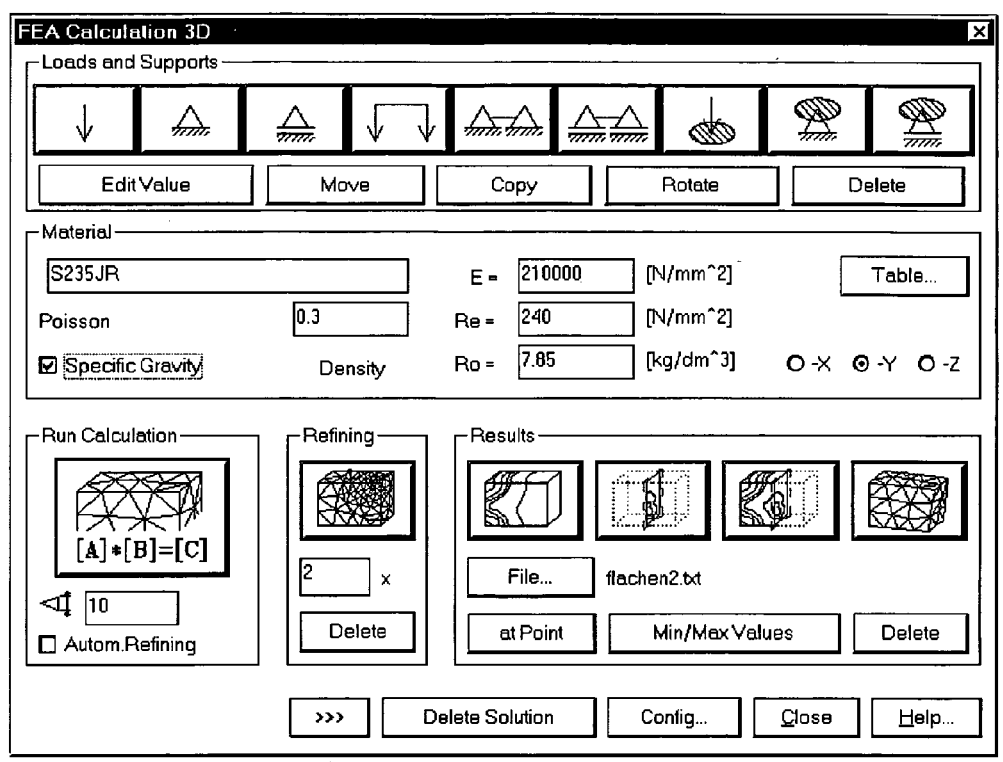
FIG. 3 and FIG. 4 depict possible dialog windows that are shown to the user at certain processing stages of the present sample embodiment.

In response to selection of the body B, a main dialog window is presented to the user. This main dialog window is shown in FIG. 3 and will be described in more detail below. Continuing with step 22 of FIG. 2, the user next selects the type of load/support condition to be defined for the FEA calculation. In more detail, the user has to make two independent choices. The first choice is that of determining whether the load/support condition shall model a load on the body, or a fixed support of the body, or a movable support of the body. The second choice is that of determining whether the load/support shall act on a single point of the surface of the body B, or along a loop of the body B (i.e., a curve consisting of at least one edge of the body B), or on a whole face of the body B, or on a region within a face of the body B. This second choice determines the further flow of execution in the diagram of FIG. 2.

If the user specifies that the load/support acts on a single point (branch "yes" of test 24), the user is asked first to select a face of the body B (step 26) and then to define a point within this face (step 28). If the user specified that the load/support acts along a loop (branch "yes" of test 30), first a selection of the loop (step 32) and then a definition of start and end points on the loop (step 34) is required. Alternatively, the user may also define that the load/support acts on the complete (closed) loop. Steps 26–28 and 32–34 represent features known in the prior art (the Genius Desktop 3 product mentioned above) and are therefore not the subject of the present invention.

If a load/support acting on a face of a body is to be defined (branch "yes" of test 36; this test does not have a "no" branch since no further possibility exists), the user is first asked to select a face of the body (step 38). This face selection step 38, which works in the same way as step 26, is illustrated in FIG. 6. The user first performs a mouse click on an edge E of the face F to be selected (the mouse cursor is shown as crosshairs in FIG. 6). A loop comprising the edge E (and defining the face F) is then highlighted by dashed lines. Since the user's mouse click normally does not define a loop uniquely, the user has the choice of either confirming the selection of the highlighted face F or switching to another face encircled by another loop that also contains the selected edge E.

Figure 4:
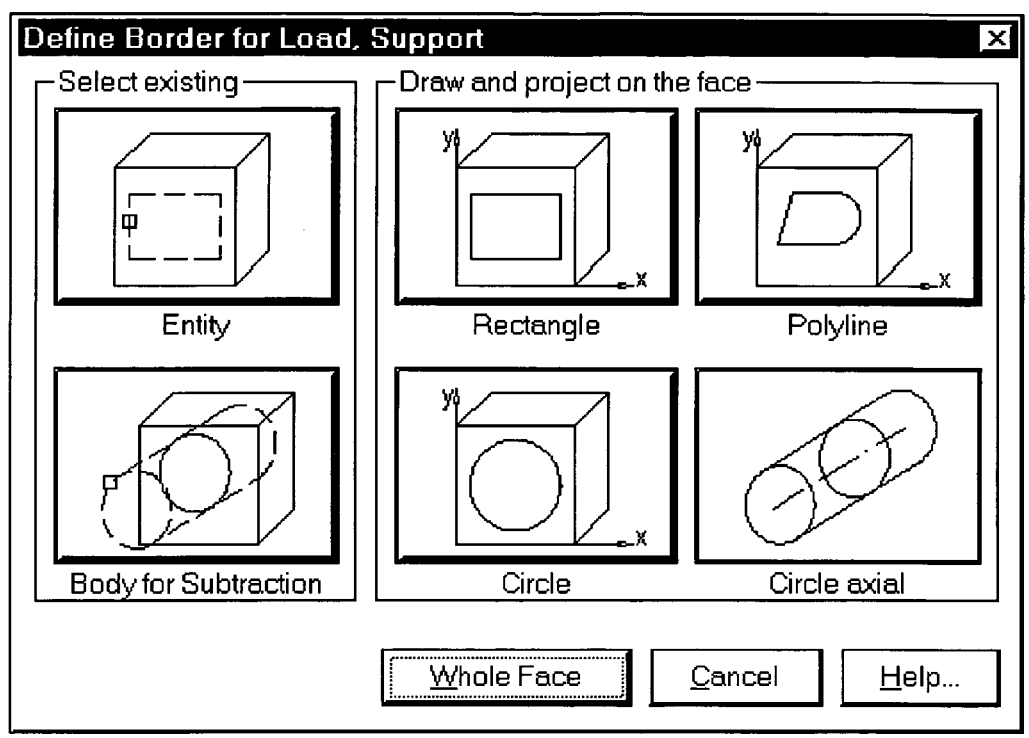

After the selection of face F has been confirmed (thus concluding step 38), the dialog window depicted in FIG. 4 is shown to the user. This window will be explained in more detail below. Continuing in FIG. 2, the "yes" branch of test 40 is taken if the user selects the "whole face" control field in the dialog window of FIG. 4. The "no" branch of test 40 of FIG. 2 is taken for any other method selection from the dialog window, and a region within the selected face F is defined in step 42. The details of step 42 are shown in the flow diagram of FIG. 5, which will be explained below.

Returning to FIG. 2, the type of the load/support condition and its geometrical extension have now been defined for all possible cases. The user is asked to enter further properties of the load/support condition in step 44. For example, such further properties are the amount and direction of load forces and the direction of movable support forces. For load and movable support forces that act on a curved loop or face or region, it must be defined whether the direction of the force is constant or normal to each point of the loop/face/region. Furthermore, the definition of a region within the face F may either mean that the corresponding load and support forces act inside the region, or within the face F, but outside the region. This information may be provided to the CAD program 10 either during step 42 (e.g., by positioning the insertion point used when defining the region inside or outside the region), or in step 44. Further or fewer or other properties of the load/support conditions may be required in alternative embodiments.

Step 44 finishes the definition of a single load/support condition in the presently described embodiment. The user may now enter another load/support condition in the same way as described above ("yes" branch of test 46 jumping back to step 22). When all load/support conditions have been defined ("no" branch of test 46), properties of the material of the body B, on which the finite element analysis shall be based, are entered in step 48. The user may directly enter physical parameters like the modulus of elasticity or Young's modulus, the yield point, the Poisson's ratio and the density of the material, or he/she may take these parameters from a predefined table (see group box "material" in the main dialog window of FIG. 3).

Referring again to FIG. 2, the FEA is now performed in step 50, and the results are displayed in step 52. A more detailed description of step 50 will be given below in connection with FIG. 8. The various possibilities for and methods of displaying the results to the user in step 52 are known in the art of finite element analysis and are not the subject of the present invention.

The main dialog window shown in FIG. 3 comprises control fields for the individual steps and operations mentioned above. The control fields showing icons in the top group box (entitled "loads and supports") concern the selection of step 22. From left to right, these control fields define:
 a load acting on a single point,
 a fixed support acting on a single point,
 a movable support acting on a single point,
 a uniform load acting along a loop,
 a fixed support acting along a loop,
 a movable support acting along a loop,
 a uniform load acting on a whole face or a region within the face,
 a fixed support acting on a whole face or a region within the face, and
 a movable support acting on a whole face or a region within the face.

The further group boxes in the main dialog window of FIG. 3 concern the definition of material properties (group box "material" corresponding to step 48 of FIG. 2), the running and refining of FEA calculations (group boxes "run calculation" and "refining" corresponding to step 50 of FIG. 2), and the various possibilities of displaying the results (group box "results" corresponding to step 52 of FIG. 2).

Figure 5:
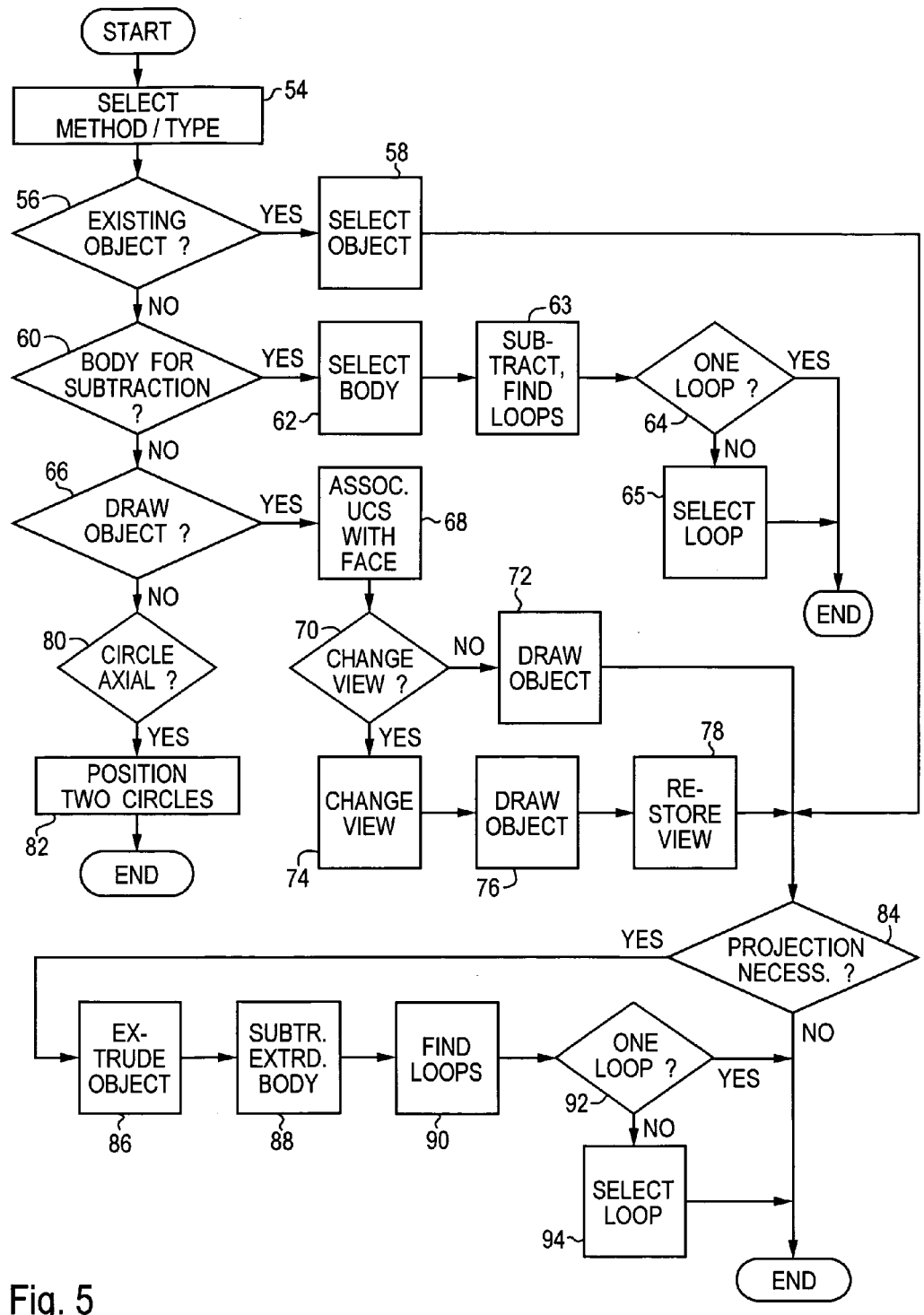
FIG. 5 shows a flow diagram of the method of defining a region within a face in the present sample embodiment.

The flow diagram of FIG. 5 shows the methods available for performing step 42 in FIG. 2, i.e., for defining a region within the selected face F of the body B. As mentioned above, the dialog window shown in FIG. 4 is displayed to the user after selection of the face F in step 38 of FIG. 2. A mouse click on one of the six selection fields in the group boxes "select existing" and "draw and project on the face" initiates the corresponding method for selection and, if applicable, also defines the type of an object to be drawn (step 54 in FIG. 5).

The "yes" branch of test 56 is taken if the user clicks on the control field "entity" in the group box "select existing" of the dialog window (FIG. 4). In this case, an existing object is chosen by the user for defining the region of the load/support condition (step 58). The selected object may, for example, be a circle or a closed polyline or a rectangle. In different embodiments of the present invention, it may or may not be required that the selected object is fully or partially contained within the face F.

A second way for defining the region within the face on the basis of existing objects can be chosen by clicking on the control field titled "body for subtraction" in the group box "select existing" of the dialog window (FIG. 4). In this selection method ("yes" branch of test 60 in FIG. 5), the user first chooses another existing body (step 62) intersecting the body B selected in step 20. The region used for defining the load/support condition is then delimited by a loop of the intersection of the newly selected body with the face F (selected in step 38) of the body B. First, in step 63, the intersection is calculated by a subtraction operation, and all loops of the intersection that are fully contained within the selected face F are determined. If there is only one such loop ("yes" branch of test 64), it defines the region within the face F. If there are several loops ("no" branch of test 64; this may happen if, for example, the selected face F is spherical or cylindrical), the user is prompted to select one of these loops for defining the region (step 65).

The method "select existing body for subtraction" may also be used for determining regions defined by the contact area between the face F selected in step 38 and the body selected in step 62. Therefore, this method would be appropriate in the example mentioned initially where a drinking glass standing on a table was to be modeled.

The three control fields named "rectangle", "polyline" and "circle" in the group box "draw and project on the face" of the dialog window of FIG. 4 each call a method for drawing an object. As an example, FIG. 7c shows a square object O being drawn on the upper face F of the selected body B. In this example, the object O exactly corresponds to the region R to be defined within the face F. This is because both the object O and the face F are flat and because the object O is fully contained in the face F.

Choosing one of the control fields "rectangle", "polyline" and "circle" in FIG. 4 also designates the type of the object to be drawn as a rectangle or a polyline (object having a plurality of line or arc segments connected to each other) or a circle, respectively. In alternative embodiments, further or fewer or other object types, in particular all types of planar or non-planar curves, may be provided. Furthermore, some embodiments may impose the restriction that the object must be drawn on or within the selected face F or must be associated with the selected face F in another way.

After selecting the draw object method ("yes" branch of test 66 in FIG. 5), the CAD program 10 first associates the user coordinate system (UCS) with the selected face F (step 68). An example of the resulting display is shown in FIG. 7a. The user may now change the origin and/or the orientation of the UCS. Furthermore, the user is asked whether the direction of view shall be changed temporarily to facilitate the drawing of the object O. If this is not desired ("no" branch of test 70), the view remains as shown in FIG. 7a, and the user draws an object of the type selected in step 54 onto the face F yielding, for example, the situation shown in FIG. 7c.

The "yes" branch of test 70 is taken if the user desires a temporary change of the direction of view. In this case, the view is changed in step 74 according to the displayed UCS such that the X and Y axes of the UCS define the X and Y axes of the changed view, and the Z axis of the UCS runs in parallel to the direction of view. In other words, the direction of view is normal to the selected face F. FIG. 7b depicts an example of this changed view after step 74. The user may now draw the object O on the face F as in a two-dimensional drawing program (step 76 of FIG. 5). The result, for the example of a rectangular object O, is shown in FIG. 7b. After the object O has been drawn, the original view of the body B is restored in step 78 (see FIG. 7c). As mentioned above, the borders of the drawn object O define the region R within the face F used in the definition of the load/support condition. The load/support may be defined to act either within the region R or on the whole face F with the exception of the region R.

The sixth control field of the dialog window shown in FIG. 4 concerns the "circle axial" method of defining a region. If this method is selected ("yes" branch of test 80; a "no" branch is not necessary since no further selections exist), the user is prompted to position two circles along the length of the selected body B, which must be a cylinder (step 82). The selected region is then delimited by these two circles. This method is useful for defining forces acting on shaft bearings.

As mentioned above, some embodiments of the present invention enforce the requirement that the object O selected in step 58 or drawn in step 72 or 76 must fully lie within the face F. In other embodiments of the invention, more flexibility for the user is provided if objects O may be selected in step 58 that are not fully contained within the face F, or if such objects O may be drawn in step 72 and/or step 76. These possibilities may especially be useful if the face F is a curved face and/or if non-planar objects O may be selected or drawn. The sample embodiment shown in FIG. 5 comprises these possibilities. It may therefore be necessary to obtain the region R by means of a projection of the object O onto the face F.

Test 84 of FIG. 5 determines whether or not a projection of the selected or drawn object O onto the face F is necessary. If the object O is already fully contained within the face F, the object O and the region R coincide, and no further steps are performed ("no" branch of test 84). Otherwise, the object O is projected onto the face F in order to obtain the region R. The direction of this projection can either be defined by the user or can be specified by the UCS or can be determined automatically (for example, the projection can be along a line connecting a reference point of the face F with a reference point of the object O).

For performing the projection, the object O is extruded in step 86 along the projection direction to obtain an extruded body. The extrusion length is determined automatically such that the extruded body fully intersects the selected body B. Then, in step 88, an auxiliary body is formed by subtracting the extruded body from the selected body B. All loops of the auxiliary body that are fully contained within the selected face F are determined in step 90. Test 92 and step 94 correspond to test 64 and step 65 described above. The auxiliary body is then deleted, and the method of FIG. 5 ends.

Figure 8:
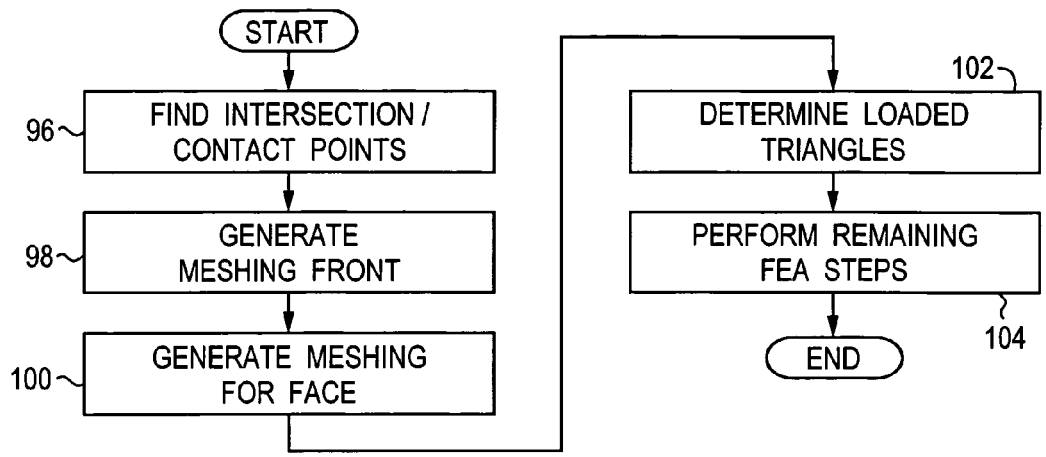
FIG. 8 shows a flow diagram of some preparatory steps of the finite element analysis performed in the present sample embodiment.

FIG. 8 shows some of the initial mesh generation steps of the FEA calculation (step 50 in FIG. 2). These steps primarily concern the situation that more than one region has been defined within a single face because of a repeated execution of the program loop comprising the "yes" branch in test 46 of FIG. 2. As an example, FIG. 9a shows a face F in which a first load/support condition has been defined based on a rectangular region R1 and a second load/support condition has been defined based on a circular region R2.

Figure 9A:
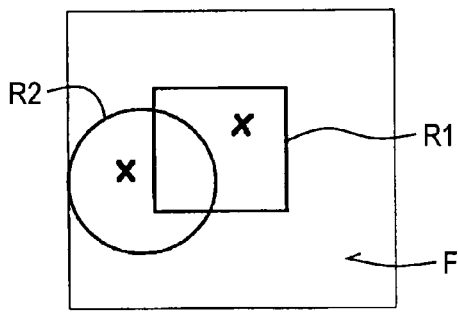
FIG. 9a–FIG. 9c illustrate some of the steps shown in FIG. 8.

The "x"-shaped marks in FIG. 9a denote the positions where the user has inserted the main symbol for each load/support condition, thus defining whether the force/support is to act within or outside the regions R1, R2. In the example of FIG. 9a, the two main symbols have been placed within the corresponding regions R1, R2. This corresponds to load/support conditions applicable within the regions. More in detail, both load/support conditions apply for the intersection portion of regions R1, R2, and no load/support condition applies for the portion of the face F not covered by any of the regions R1, R2. Only the first load/support condition is applicable for the remaining part of the region R1, and only the second load/support condition is applicable for the remaining part of the region R2.

The steps shown in FIG. 8 have the objective of determining FEA load/support parameters according to the overlapping load/support conditions described above. First, intersection points between the borders of the defined regions are determined in order to identify any overlapping portions (step 96). This is a straightforward task for planar faces F and simple geometric forms of the regions R1, R2. For curved faces F and/or regions R1, R2 having a complex shape (in particular NURBS curves; NURBS=non-uniform rational B-spline), some projection steps are normally required since such curves are represented internally as approximations consisting of short straight line segments. It must be ascertained that reasonable approximations of the intersection points are found and projected onto the face F.

The internal line segment representation is chosen with a view to the future triangulation of the face F in step 100. There, curved structures will be approximated by line segments (sides of triangles) in any case. Any intersection point found in step 96 will later be a corner point of a triangle in the triangulation. This ensures that the triangulation will be compatible with the geometrical shapes and overlapping properties of the regions R1, R2.

Step 96 further contains the operation of finding contact points between each region R1, R2 and the edges E of the face F. This operation is also performed if only a single region has been defined. Any contact point between the region and the edge is found in an iterative approximation process. The contact point will also be used as a corner point of a triangle in the future triangulation in step 100, thus ensuring that the contact point will be considered as accurately as possible in the ensuing FEA calculations. In alternative embodiments, step 96 is omitted. The accuracy obtained by the FEA calculations will still be sufficient if a fine mesh size is used.

Figure 9B:
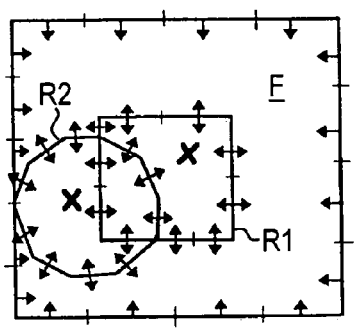

The following step 98 concerns the generation of the initial meshing front. The result of this step is shown, as an example, in FIG. 9b. The initial meshing front consists of approximated line segment representations for each portion of the borders of the regions R1, R2 and the edges of the face F, each said portion connecting two of the intersection/contact points found in step 96. This ensures that each intersection/contact point coincides with a corner of a meshing triangle generated in step 100. Front lines to only one side will be generated for the border portions coinciding with the edges of the face F (single-headed arrows in FIG. 9b), while two-sided front lines will be generated for the border portions of the regions R1, R2 (double-headed arrows in FIG. 9b).

Figure 9C:
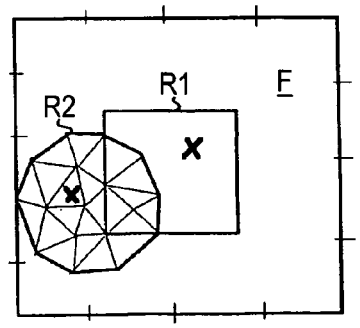

A mesh generator, which is known per se in the art, is now called in step 100 to generate a triangular meshing for the whole face F. The mesh is generated such that each of the initial front lines obtained in step 98 coincides with a side of a mesh triangle. This ensures that the generated mesh is compatible with the geometrical shapes of the defined load/support conditions. FIG. 9c shows, as an example, the meshing generated for the inside of the region R2. The meshing outside of the region R2 has also been generated in step 100, but it is not shown in FIG. 9c for the sake of clarity.

In step 102 the load conditions for each triangle of the mesh are determined. For each main symbol inserted by the user ("x"-shaped mark in FIG. 9a–FIG. 9c), the following operations are performed: the mesh triangle enclosing the main symbol is identified, and all bordering triangles are recursively determined until a border of the corresponding load/support condition is reached. Thus all triangles for which a load/support condition applies are identified. Of course, there may be triangles for which several load/support conditions are applicable (e.g., the triangles in the intersection portion of regions R1, R2 in FIG. 9c). For example, if a triangle is covered by more than one load condition, the sum of the forces defined in these conditions will be taken as the force acting on the triangle.

This completes the preparation and meshing steps. The remaining FEA calculations are now performed in step 104. These calculations are known in the art (e.g., from the books mentioned initially) and are not the subject of the present invention.

The invention claimed is:

1. A method for defining at least one parameter for a finite elements analysis (FEA) calculation in a computer-assisted drafting (CAD) program, said method comprising:
   a) determining a body for which said parameter is to be defined, said body being an entity processed by said CAD program; and
   b) using at least one graphical fiction of said CAD program to define a region within a face of said body, said region being used to define a load/support condition for said FEA calculation.

2. The method of claim 1, wherein step b) comprises at least one of the sub-steps of:
   selecting a type of said load/support condition to be defined,
   selecting said face of said body, and
   defining further properties of said load/support condition.

3. The method of claim 1, wherein said load/support condition for said FEA calculation is a condition selected from the following group of conditions:
   a load condition inside said region,
   a load condition outside of said region,
   a support condition inside said region, and
   a support condition outside of said region.

4. The method of claim 1, wherein said graphical function of said CAD program is a function selected from the following group of functions;
   a function of drawing an object, said object being used to delimit said region, and
   a function of selecting an object, said object being used to delimit said region.

5. The method of claim 4, wherein said object is drawn on said face of said body.

6. The method of claim 4, wherein the view in which said body is displayed by said CAD program is temporary changed for facilitating drawing of said object.

7. The method of claim 4, comprising the step of calculating a projection of said object onto said face for determining said region.

8. The method of claim 1, wherein said graphical function of said CAD program is a function of subtracting a selected body from said body determined in step a).

9. The method of claim 1, wherein step b) is repeated to define a plurality of regions within at least one face of said body, each region of said plurality of regions being used to define at least one load/support condition for said PEA calculation.

10. The method of claim 9, further comprising at least one of the steps of determining intersection points between the defined plurality of regions and determining overlapping portions of said plurality of regions.

11. The method of claim 9, wherein the loads acting on overlapping portions of said plurality of regions are defined as the sums of the individual loads acting on each region.

12. The method of claim 1, wherein said face of said body is a curved face.

13. The method of claim 1, wherein said region used to define said load/support condition is a curved region.

14. The method of claim 1, comprising the further step of deter contact points of said region to an edge of said face.

15. The method of claim 1, wherein mesh elements am generated in a meshing step of said FEA calculation such that the borders of the mesh elements follow the borders of said region.

16. A computer program product for execution by a general purpose computer for defining at least one parameter for a finite elements analysis (FEA) calculation in a computer-assisted drafting (CAD) program said computer program product including instructions for determining a body for which said parameter is to be defined, said body being an entity processed by said CAD program and said computer program product further including instructions for defining a region within a face of said body using at least one graphical function of said CAD program, said region being used to define a load/support condition for said PEA calculation.

17. The computer program product of claim 16, wherein said graphical function of said CAD program is a function selected from the following group of functions:
   a function of draw an object, said object being used to delimit said region, and
   a function of selecting an object, said object being used to delimit said region.

18. The computer program product of claim 16, wherein a plurality of regions is defined within at least one face of said body, each region of said plurality of regions being used to define at least one load/support condition for said PEA calculation.

19. The computer program product of claim 18, wherein the loads acting on overlapping portions of said plurality of regions are defined as the sums of the individual loads acting on each region.

20. An apparatus comprising a general purpose computer programmed for defining at least one parameter for a finite elements analysis (FEA) calculation in a computer-assisted drafting (CAD) program, said general purpose computer being programmed for determining a body for which said parameter is to be defined, said body being an entity processed by said CAD program; and said general purpose computer being further programmed for defining a region within a face of said body using at least one graphical function of said CAD program, said region being used to define a load/support condition for said FEA calculation.

21. The apparatus of claim 20, wherein said graphical function of said CAD program is a function selected from the following group of functions:
   a function of drawing an object, said object being used to delimit said region, and
   a function of selecting an object, said object being used to delimit said region.

22. The apparatus of claim 20, wherein a plurality of regions is defined within at least one face of said body, each region of said plurality of regions being used to define at least one load/support condition for said FEA calculation.

23. The apparatus of claim 22, wherein the loads acting on overlapping portions of said plurality of regions are defined as the sums of the individual loads acting on each region.

* * * * *

UNITED STATES PATENT AND TRADEMARK OFFICE
CERTIFICATE OF CORRECTION

PATENT NO.       : 7,107,193 B1
APPLICATION NO.  : 09/651031
DATED            : September 12, 2006
INVENTOR(S)      : Peter Hummel et al.

Page 1 of 1

It is certified that error appears in the above-identified patent and that said Letters Patent is hereby corrected as shown below:

In the Claims

Column 10, line 54, Claim 14, please delete the word "deter" and replace with the word --determining--.

Column 11, line 2, Claim 16, please delete the word "PEA" and replace with the word --FEA--.

Column 11, line 7, Claim 17, please delete the word "draw" and replace with the word --drawing--.

Column 11, line 14, Claim 18, please delete the word "PEA" and replace with the word --FEA--.

Signed and Sealed this
Twentieth Day of May, 2014

Michelle K. Lee
*Deputy Director of the United States Patent and Trademark Office*